US011320471B1

(12) United States Patent
Elwakil et al.

(10) Patent No.: US 11,320,471 B1
(45) Date of Patent: May 3, 2022

(54) METHOD OF MEASURING IMPEDANCE USING GAUSSIAN WHITE NOISE EXCITATION

(71) Applicant: University of Sharjah, Sharjah (AE)

(72) Inventors: Ahmed Elwakil, Sharjah (AE); Anis Allagui, Sharjah (AE); Sohaib Majzoub, Sharjah (AE)

(73) Assignee: University of Sharjah, Sharjah (AE)

( * ) Notice: Subject to any disclaimer, the term of this patent is extended or adjusted under 35 U.S.C. 154(b) by 0 days.

(21) Appl. No.: 17/342,603

(22) Filed: Jun. 9, 2021

(51) Int. Cl.
*G01R 27/16* (2006.01)
*G01R 27/04* (2006.01)

(52) U.S. Cl.
CPC ............. *G01R 27/16* (2013.01); *G01R 27/04* (2013.01)

(58) Field of Classification Search
CPC ................................ G01R 27/16; G01R 27/04
See application file for complete search history.

(56) References Cited

U.S. PATENT DOCUMENTS

| | | | |
|---|---|---|---|
| 7,675,293 B2 | 3/2010 | Christophersen | |
| 9,746,506 B2 | 8/2017 | Lafontaine | |
| 9,820,669 B2 | 11/2017 | Bonmassar | |
| 2003/0098805 A1* | 5/2003 | Bizjak | H03G 7/002 341/139 |
| 2008/0208538 A1* | 8/2008 | Visser | G10L 21/0272 702/190 |
| 2013/0230090 A1* | 9/2013 | Lv | H04L 27/22 375/232 |
| 2014/0172338 A1* | 6/2014 | Lafontaine | G01R 25/00 702/65 |
| 2020/0341040 A1* | 10/2020 | Maki-Ontto | G01R 27/16 |

OTHER PUBLICATIONS

Giorgio Bonmassar, "Improved Sensing Pulses for Increased Human Head Depth Measurement Sensitivity With Electrical Impedance Spectroscopy", Journal, 2012, 3306-3313, vol. 60, No. 12, IEEE Transactions on Biomedical Engineering.

(Continued)

*Primary Examiner* — Jeff W Natalini
(74) *Attorney, Agent, or Firm* — Hayes Soloway PC

(57) ABSTRACT

A method of impedance measurement of a device under test (DUT) is disclosed based on a random excitation signal, the method comprising the steps of generating the random excitation signal, applying the generated random excitation signal to the DUT through two points of a data acquisition board (DAQ) and re-structuring the converted random excitation signal through a plurality of iterative calibration loops, wherein spectral phase of the random excitation signal is derived from a discrete uniform distribution and its time domain amplitude is controllable. The random excitation signal is a structured Gaussian White Noise (GWN) signal or sequence, which is generated based on the user-defined input parameters such as white noise power level, frequency range between the minimum and maximum frequencies ($F_{min}$ and $F_{max}$), and frequency step ($F_{step}$).

15 Claims, 9 Drawing Sheets

(56) References Cited

OTHER PUBLICATIONS

Giorgio Bonmassar, "Dual energy pulses for Electrical Impedance Spectroscopy with the stochastic Gabor function", Symposium, 2012, 2012 Annual International Conference of the IEEE Engineering in Medicine and Biology Society.

P. Kassanos, "A CMOS magnitude/phase measurement chip for impedance spectroscopy", Journal, 2013, 2229-2236, vol. 13, No. 6, IEEE Sensors Journal.

Z. Jiang, "Development of a portable electrochemical impedance spectroscopy system for bio-detection", Journal, 2019, 5979-5987, vol. 19, No. 15, IEEE Sensors Journal.

E. Piuzzi, "Low-cost and portable impedance plethysmography system for the simultaneous detection of respiratory and heart activities", Journal, 2019, 2735-2746, vol. 19, No. 7, IEEE Sensors Journal.

S. Rodriguez, "A batteryless sensor ASIC for implantable bio-impedance applications", Journal, 2015, 533-544, vol. 10, No. 3, IEEE Trans. Biomedical Circuits and Systems.

S. Subhan, "A harmonic error cancellation method for accurate clock-based electrochemical impedance spectroscopy", Journal, 2019, 710-724, vol. 13, No. 4, IEEE Trans. Biomedical Circuits and Systems.

A Al-Ain, "Extraction of phase information from magnitude-only bio-impedance measurements using a modified Kramers-Kronig transform", Journal, 2018, 3635-3650, vol. 37, No. 8, Circuits, Systems, and Signal Processing.

B. Sanchez, "Basics of broadband impedance spectroscopy measurements using periodic excitations", Journal, 2012, 1-14, vol. 23, No. 10, Measurement Science and Technology.

E. Van Gheem, "Electrochemical impedance spectroscopy in the presence of non-linear distortions and non-stationary behaviour: Part I: Theory and validation", Journal, 2004, 4753-4762, vol. 49, No. 26, Electrochimica Acta.

P. Annus, "Multisine and binary multifrequency waveforms in impedance spectrum measurement—A comparative study", Journal, 2011, 1265-1268, in 5th European Conference of the International Federation for Medical and Biological Engineering, Springer.

Y. Yang, "Multifrequency simultaneous measurement of bioimpedance spectroscopy based on a low crest factor multisine excitation", Journal, 2015, 489-501, vol. 36, No. 3, Physiological Measurement.

M. Min, "Broadband spectroscopy of dynamic impedances with short chirp pulses", Journal, 2011, 945-958, vol. 32, No. 7, Physiological Measurement.

J. Ojarand, "On the selection of excitation signals for the fast spectroscopy of electrical bioimpedance", Journal, 2018, 133-141, vol. 9, Journal of Electrical Bioimpedence.

R. L. Namin, "Effect of adc resolution on lowfrequency electrical time-domain impedance spectroscopy", Journal, 2017, 425-436, vol. 24, No. 2, Metrology and Measurement Systems.

M. Kowalewski, "Fast high-impedance spectroscopy method using Sinc signal excitation", Journal, 2013, 645-654, vol. XX, No. 4, Metrology and Measurement Systems.

J. Sihvo, "A fast approach for battery impedance identification using pseudo random sequence (PRS) signals", Journal, 2020, 2548-2557, vol. 35, No. 3, IEEE Trans. Power Electronics.

G. Blanc, "Measurement of the electrode impedance in a wide frequency range using a pseudorandom noise", Journal, 1975, 599-601, vol. 20, No. 8, Electrochimica Acta.

B. Daroczy, "Generation of optimum pseudorandom signals for respiratory impedance measurements", Journal, 1990, 21-31, vol. 25, No. 1, International Journal of Bio-Medical Computing.

R. Robinson, "System noise as a signal source for impedance measurements on batteries connected to operating equipment", Journal, 1993, 381-388, vol. 42, No. 3, Journal of Power Sources.

K. Barbe, "Measurement of Cole-Davidson diffusion through Pade approximations for (bio)impedance spectroscopy", Journal, 2020, 301-310, vol. 69, No. 1, IEEE Trans. Instrumentation and Measurement.

* cited by examiner

METHOD OF MEASURING IMPEDANCE USING GAUSSIAN WHITE NOISE EXCITATION

FIELD OF THE INVENTION

The present invention relates to an impedance measurement method, and more particularly a fast impedance measurement method based on a structured Gaussian white noise excitation.

BACKGROUND OF THE INVENTION

Background description includes information that may be useful in understanding the present invention. It is not an admission that any of the information provided herein is prior art or relevant to the presently claimed invention, or that any publication specifically or implicitly referenced is prior art.

Electrochemical Impedance Spectroscopy (EIS) is a versatile characterization tool that is widely used to probe and characterize the electrical changes induced in materials as a result of different electrochemical reactions. EIS is also used as a precise sensory technique in industrial processes and energy storage device measurements. In EIS the applied excitation can be a voltage source (known as potentiostatic mode) or a current source (known as galvanostatic mode). A three-electrode setup (working electrode, reference electrode and counter electrode) is most commonly used in EIS. Four-electrode differential measurements or two electrode single-ended measurements can also be used. Low frequencies and ultra-low sub-hertz frequencies are particularly important in EIS since the majority of its sensory applications are in slowly varying processes.

For EIS measurement, a sinusoidal voltage (or current) excitation with known amplitude and frequency is applied and the resulting response current (or voltage) is measured both in terms of magnitude and phase shift (with respect to the applied excitation). A digitally-controlled oscillator is used to sweep the frequency of the applied signal and repeat the magnitude/phase measurements at each frequency point. This technique is not only used in high-end impedance analyzers but is also used in inexpensive single chip impedance analyzer solutions (for example, using AD5933 chip from Analog Devices). Meanwhile, the demand for portable impedance analyzers has greatly increased due to the growing number of biological and biomedical applications of EIS, which has led to many recent innovative designs in this regard.

The innovation can either be in the hardware design, implementation or in the signal processing required to compute the impedance spectrum. For example, a recently proposed device used the Kramer-Kronig transform to compute the phase response from the measured magnitude response, which drastically simplifies the hardware. However, this technique suffers from accuracy problems at very low frequencies due to the difficulty of obtaining enough sample points below these frequencies. Another direction for innovation is focused on reducing the time needed to perform EIS measurements and hence reduce the power consumption as well. To appreciate the importance of this issue, consider measuring the impedance using the classical sinusoidal excitation method at a frequency of 1 mHz averaged over 2 consecutive cycles in order to improve the accuracy. Such a measurement takes around 33 minutes in time, which is clearly not practical for portable devices or for real-time on-line monitoring applications. Furthermore, it is not accurate to measure the impedance of (bio)electrochemical systems over such a long period of time since these systems may be time-varying. To reduce the measurement time, the use of wide-band excitation signals was proposed.

Wide-band signals also enable the acquisition of time-varying instantaneous impedance spectra data which is useful for the study of continuously-evolving systems. Many such signals with different properties have been studied and used including multi-sine signals, periodic digital clocks and chirp signals. These signals have been used to cover a larger bandwidth, extending into the MHz range, but have not been used to cover the sub-Hz range which requires using very low frequency oscillators. Also, these signals do not have a constant power profile which can lead to measurement errors at frequencies associated with low power values. Other pulse-type signals, such as the sin(x)/x function, have been used for sub-Hz measurements (for example in the range 10 mHz to 1 Hz). The use of pseudo-random sequences was proposed as a wide-band excitation alternative and was first implemented with limited accuracy. The use of a truly random noise signal as a source of excitation for impedance measurement was used for battery characterization over the frequency range 6 Hz-50 Hz. No previous attempts have been made to alter the power spectrum of the signal in order to extend its bandwidth or improve the accuracy while minimizing the transient effects, which remains a challenging task. Renewed interest in the use of random signals for impedance measurement was based on a random-phase multi-sine signal. The constructed excitation signal was a summation of different harmonics in the form:

$$r(t) = \sum_{k=1}^{N} M_k \sin(k\omega_0 t + \varphi_k)$$

with non-random amplitudes $M_k$, frequencies multiple of the fundamental harmonic $\omega_0$, and phases, $\varphi_k$, selected randomly from a uniform distribution over the interval $[0, 2\pi]$. However, this excitation signal suffers from highly fluctuating power levels due to the added random phase, resulting in measurement errors.

Therefore, there exists a need for a solution for the above listed drawbacks associated with traditional impedance measurement methods.

SUMMARY OF THE INVENTION

An objective of the present invention to propose a fast impedance measurement method, which overcomes the drawbacks associated with the above mentioned impedance measurement methods.

In an aspect of the invention, a method of impedance measurement of a device under test (DUT) based on a random excitation signal, the method comprising the steps of generating the random excitation signal, restructuring the random excitation signal through a plurality of iterative calibration loops, wherein spectral phase of the random excitation signal is derived from a discrete uniform distribution, leading to a controllable time domain amplitude. The restructured random excitation signal is then applied onto the DUT through two points of a data acquisition board (DAQ).

In an embodiment of the present invention, the random excitation signal is a structured Gaussian White Noise (GWN) signal or sequence.

In another embodiment of the present invention, the GWN signal or sequence is generated based on the user-defined input parameters: noise power level, frequency range between the minimum and maximum frequencies ($F_{min}$ and $F_{max}$), and frequency step ($F_{step}$).

In another embodiment of the present invention, the GWN signal or sequence comprises N points such that $N=(F_{max}-F_{min})/F_{step}$.

In another embodiment of the present invention, the restructured GWN signal has a flat power spectral magnitude over a wide bandwidth while having a random phase.

In another embodiment of the present invention, the restructured GWN signal is iteratively calibrated.

In another embodiment of the present invention, the discrete uniform distribution is obtained from a physically-true random number generator.

In another embodiment of the present invention, the random excitation signal is converted to a voltage or current value using a DAQ, for potentiostatic or galvanostatic measurements respectively.

In another embodiment of the present invention, the generated random excitation signal is a time domain signal.

In another embodiment of the present invention, the random excitation signal is iteratively converted from the time domain to frequency domain to restructure and finally obtain a converted random excitation signal.

In another embodiment of the present invention, the random excitation signal is converted from the time domain to frequency domain using Fast Fourier Transform (FFT) algorithm.

In another embodiment of the present invention, the plurality of iterative calibration loops maintains a random phase of the random excitation signal and re-adjusts the magnitude of the random excitation signal, thereby ensuring a uniform flat power spectrum over a target frequency range set by a user.

In another embodiment of the present invention, the target frequency range extends from $F_{min}$ to $F_{max}$ (e.g. 2 mHz to 200 kHz).

In another embodiment of the present invention, the plurality of iterative calibration loops results in increasing the amplitude at weakened frequencies due to the software and/or hardware signal processing.

In another embodiment of the present invention, a precision standard impedance cell is used as a DUT.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION OF THE INVENTION

The aspects of a method for fast impedance measurement, according to the present invention will be described in conjunction with FIGS. 1-3. In the Detailed Description, reference is made to the accompanying figures, which form a part hereof, and in which is shown by way of illustration specific embodiments in which the invention may be practiced. It is to be understood that other embodiments may be utilized and logical changes may be made without departing from the scope of the present invention. The following detailed description, therefore, is not to be taken in a limiting sense, and the scope of the present invention is defined by the appended claims.

In accordance with the present invention, a structured Gaussian White Noise (GWN) signal to be used for impedance measurement is proposed. By definition, a time series $(w_t: t=1, 2, \ldots, n)$ in which the elements $w_i$ are independent and identically distributed following a standard normal distribution with zero mean and finite variance $\sigma^2$ (i.e. $(w_t \sim N(0, \sigma^2))$, and with no serial correlation (i.e. Cor $(w_i, w_j) \neq 0, \forall\ i \neq j$) is known as a GWN. In the frequency domain, the GWN has a constant power spectral density over a limited bandwidth. Therefore, post-processing, conditioning and calibration procedures are applied on the initial GWN signal in order to engineer a final multi-value (i.e. not binary) signal of fixed power, flat magnitude, and random phase over a wide bandwidth. Experimental verification of the technique is conducted using a precise standard impedance cell over the frequency range 2 mHz-200 kHz, and its accuracy is compared to that of a research-grade Bio-logic VSP-300 electrochemical station. The results show a maximum of 2.2% deviation between the two measurements with a total speedup of 6.8 times using the proposed method in accordance with the present invention.

Figure 1A:
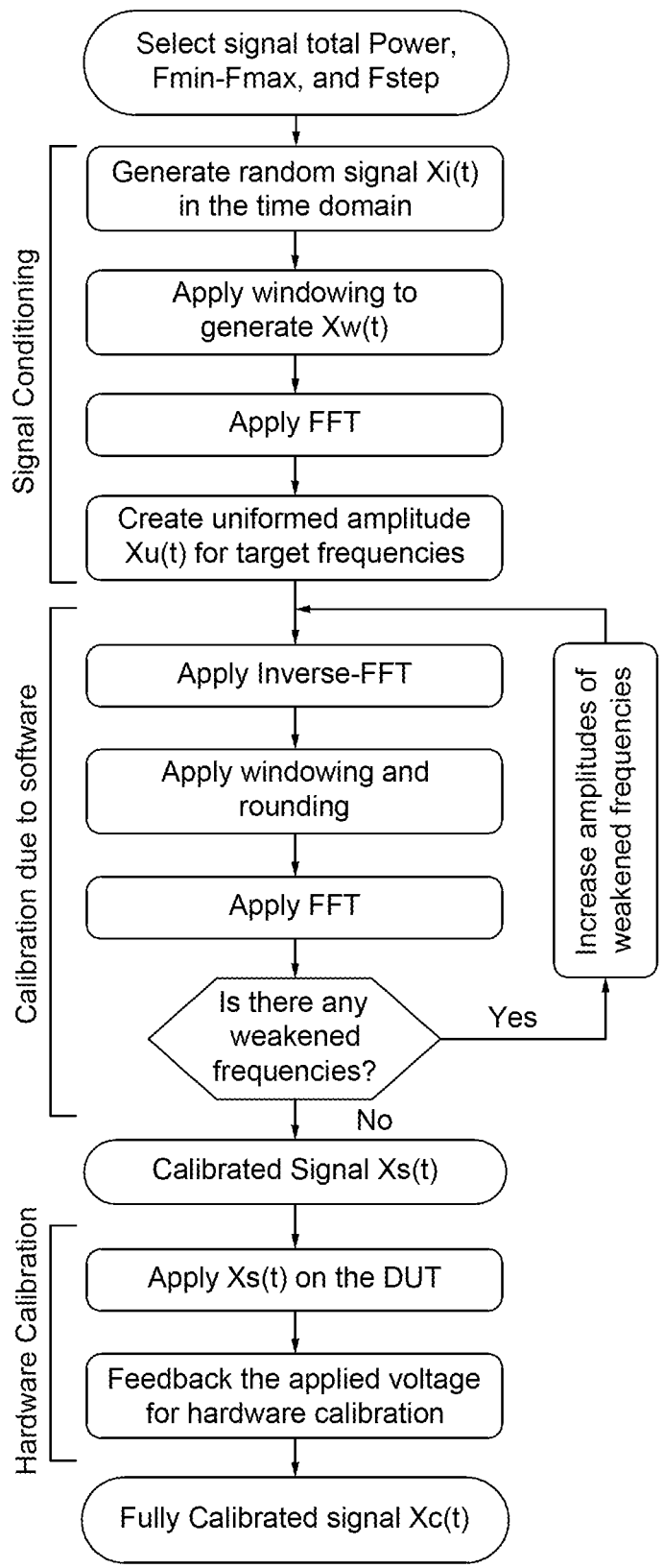
FIG. 1A is a flowchart depicting the series of steps followed in order to generate the fully conditioned and calibrated signal $X_c(t)$ of flat spectral magnitude and random phase starting with a GWN sequence $X_i(t)$ which is generated based on the user-defined input parameters: Power, $F_{min}$, $F_{max}$ and $F_{step}$.

Considering the algorithm used in accordance with the present invention, and unlike the multi-sine based random phase signal, a GWN sequence is generated to cover the target frequency range with a predefined frequency step. The amplitude of the signal is then adaptively increased to strengthen its power at selected frequency points. Subsequently, the proposed signal is calibrated to mitigate software and hardware sampling errors. FIG. 1A shows a sequential flowchart of the series of steps followed to engineer and produce the proposed signal $X_c(t)$. A GWN signal is first generated using Matlab's wgn function with the user-defined parameters: white noise power level, frequency range between the minimum and maximum frequencies, $F_{min}$ and $F_{max}$, and the frequency step, $F_{step}$. Thus, the signal contains N points such that $N=(F_{max}-F_{min})/F_{step}$. Next, this GWN signal $X_i(t)$ undergoes a signal conditioning procedure. Windowing (Blackman window) is applied onto the signal in the time domain (giving $X_w(t)$) which is a common practice in order to avoid spectral leakage. Fast-Fourier-Transform (FFT) is then used to convert the latter from time to frequency domain in order to adjust the amplitudes at the target frequencies, i.e. those between $F_{min}$ and $F_{max}$, while keeping the random phases untouched. The goal is to maintain a relatively flat power spectrum which can be achieved using the formula:

$$A_1 = CF_s \frac{1}{N} \sum_{k=1}^{N} a_k$$

Figure 1B:
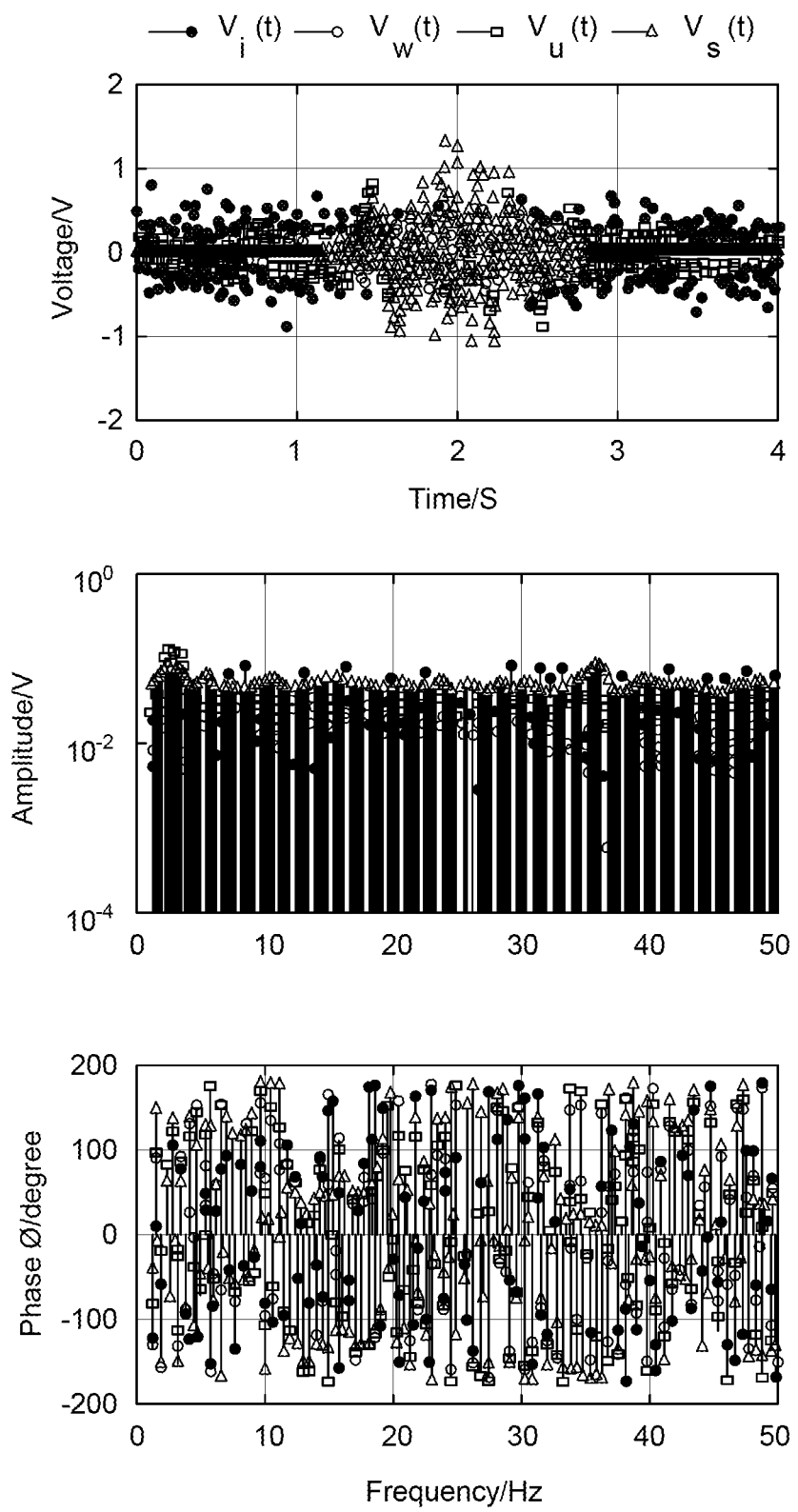
FIG. 1B depicts typical time domain and frequency domain representations of samples of the voltage signals $V_i(t)$, $V_w(t)$, $V_u(t)$ and $V_s(t)$, which correspond respectively to the signals Xi(t), $X_w(t)$, $X_u(t)$ and $X_s(t)$ in FIG. 1A.
Figure 1C:
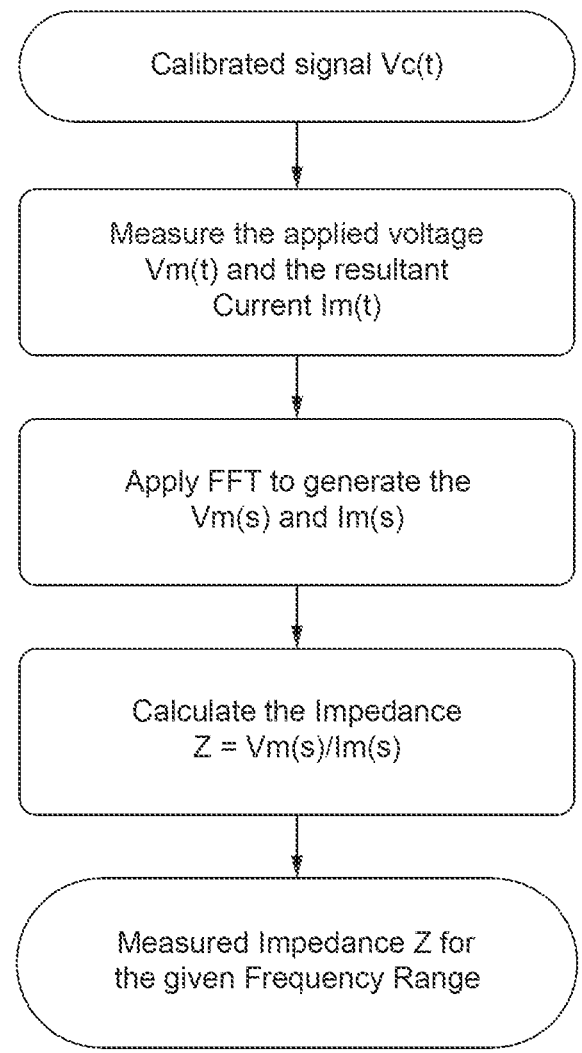
FIG. 1C is a flowchart depicting the steps followed for impedance measurement using the re-structured random signal excitation $V_c(t)$, which corresponds to the signal $X_c(t)$ in FIG. 1A.

$CF_s$ is a software calibration factor multiplied by the average amplitude of the signal (where $a_k$ is the amplitude of the individual frequency components at the target frequencies, and $A_1$ is the obtained flat amplitude). $CF_s$ is dependent on the user-defined specifications of the random signal, particularly its assigned power level. For the present invention, $CF_s$ was assigned a value between 2 and 3. In accordance with the present invention, FIG. 1A is a flowchart depicting the series of steps followed in order to generate the fully conditioned and calibrated signal $X_c(t)$ of flat spectral magnitude and random phase starting with a GWN sequence $X_i(t)$ which is generated based on the user-defined input parameters power, $F_{min}$, $F_{max}$ and $F_{step}$. FIG. 1B depicts time domain and frequency domain representations of samples of the signals $V_i(t)$, $V_w(t)$, $V_u(t)$ and $V_s(t)$. FIG. 1C is a flowchart depicting the steps followed for impedance measurement using the engineered signal $V_c(t)$.

The newly calculated amplitude $A_1$ is assigned to all frequencies within the target frequency range resulting in the signal $X_u(t)$ (as shown in FIG. 1A). However, this amplitude adjustment procedure might affect the windowing performed earlier, as well as generating values that are impractical for a Digital-to-Analog Converter (DAC) with a given resolution (which will transform the signal $X_c(t)$ to either a voltage or a current excitation). For example, if the DAC has a maximum resolution of 10 mV between two consecutive points, a smaller step value has to be rounded up or down. Thus, values between 1 mV and 10 mV have to be rounded. Therefore, as shown in the flowchart, inverse FFT is applied to $X_u(t)$, and windowing and rounding are applied again. The signal is then re-converted to the frequency domain and the amplitudes of the target frequencies are re-adjusted. Frequencies with reduced amplitudes are re-enforced with amplitude above the average so that when windowing and rounding are applied again, they remain high enough. This iterative procedure is repeated several times until the number of weakened amplitudes is minimized.

The formula used to further increase the weakened frequencies at each iteration is:

$$A_2 = CF_h \times A_1$$

$CF_h$ is a hardware calibration factor multiplied by the previously calculated $A_1$. The new amplitude $A_2$ is assigned only to the affected or weakened frequencies. Upon exiting the calibration loop, a signal $X_s(t)$ is obtained. This signal is then transformed either to a voltage or a current signal using a DAC depending on the required EIS measurement mode, and subsequently applied on the device under test (DUT). However, prior to that, the DAC output signal is re-sampled and compared with the originally generated $X_s(t)$ to make sure there is no drop in any amplitude due to the DAC limited accuracy. If this happens, weakened frequencies are re-enforced. This process is referred to as the hardware calibration which results in the fully calibrated signal $X_c(t)$ suitable for applying to the DUT. FIG. 1B shows the time domain (upper plot) and frequency domain components (middle and lower plots) of an example of the proposed signal (set to be a voltage excitation in this work) and the subsequent transformations made upon it with $F_{min}$ and $F_{max}$ being 1 Hz and 50 Hz, respectively, and $F_{step}=0.25$ Hz.

The initial GWN voltage signal ($V_i(t)$) is shown to be scattered randomly in the voltage-time series plot (see FIG. 1B) with close-to-zero mean value (0.8 mV) and a variance of $\sigma^2=60$ mV$^2$. Its corresponding phase was tested for randomness using Matlab's runstest function and found to be random with 95% confidence interval (see lower plot in FIG. 1B). The windowed signal Vw(t) is shown in the upper plot. Equation (1) is applied to modify the amplitude of $V_w(t)$, which results in the conditioned signal $V_u(t)$. Finally, the software calibrated signal $V_s(t)$ exhibits practically a frequency-independent amplitude with negligible deviation from the mean value (see middle plot in FIG. 1B). The spectral phases of these three signals are also shown in the lower plot of the figure. Finally, the flowchart in FIG. 1C shows the steps followed in order to measure the impedance of a DUT using $V_c(t)$. The measured voltage and current are referred to as $V_m(t)$ and $I_m(t)$ respectively in the figure. FFT is used to convert both signals to the frequency domain giving $V_m(s)$ and $I_m(s)$ (s=jω) on which windowing is applied. Finally, the spectral impedance for the DUT is computed from its definition Z(s)=Vm(s)/Im(s).

Figure 2A:
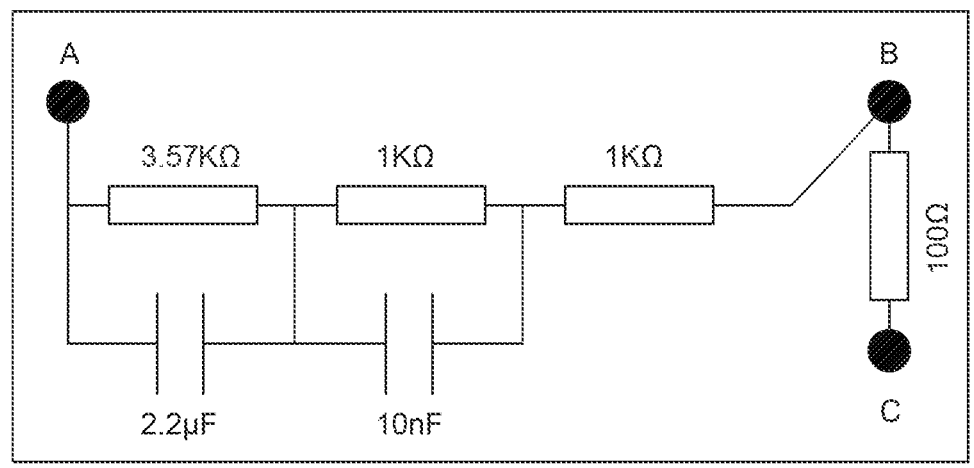
FIG. 2A shows a standard electrical calibration cell on which the measurements were carried out (DUT). The voltage $V_m(t)$ is measured between nodes A and B, and the current $I_m(t)$ is calculated as the voltage measured between nodes B and C divided by the 100-Ohm resistance.
Figure 2B:
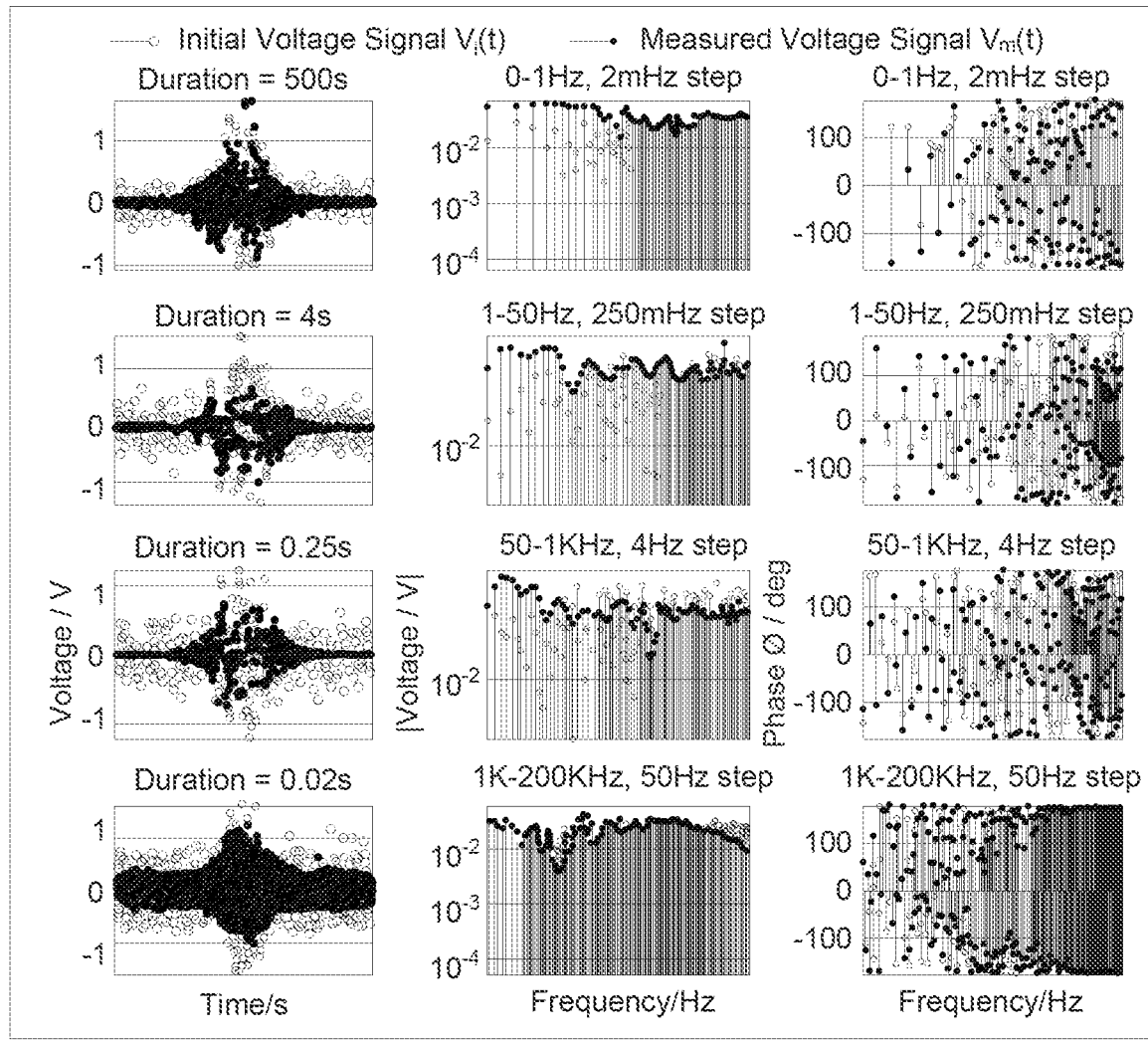
FIG. 2B depicts time domain and frequency domain components of the initial voltage signal $V_i(t)$ compared to the measured voltage signal $V_m(t)$ within different frequency ranges between $F_{min}$ and $F_{max}$ and with different frequency steps, $F_{step}$. The entire frequency range between $F_{min}$ and $F_{max}$ has been segmented into four intervals in order to help setting a limit on the maximum permissible voltage amplitude of $V_m(t)$.
Figure 2C:
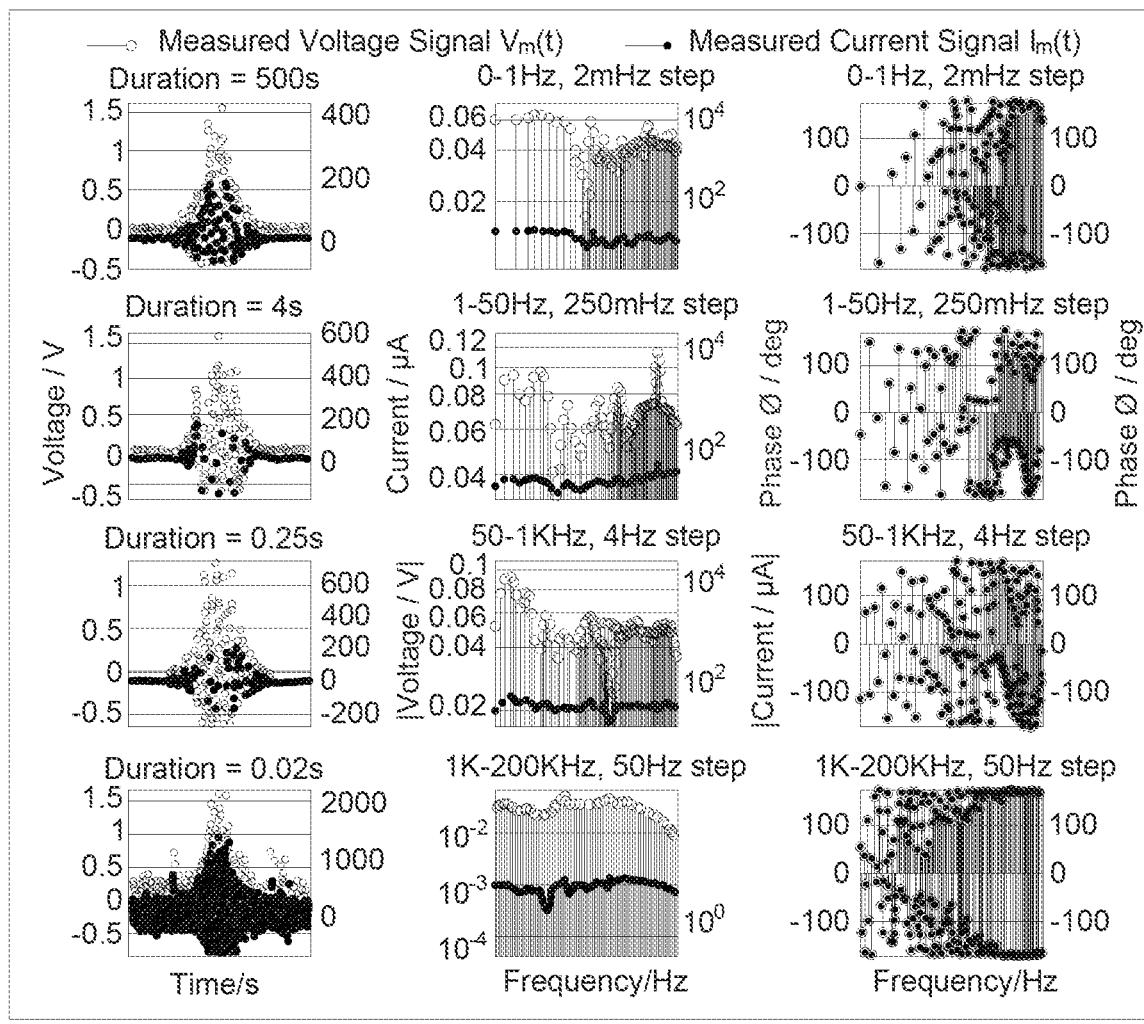
FIG. 2C depicts the measured voltage and current corresponding to the same frequency ranges as in FIG. 2B.
Figure 2D:
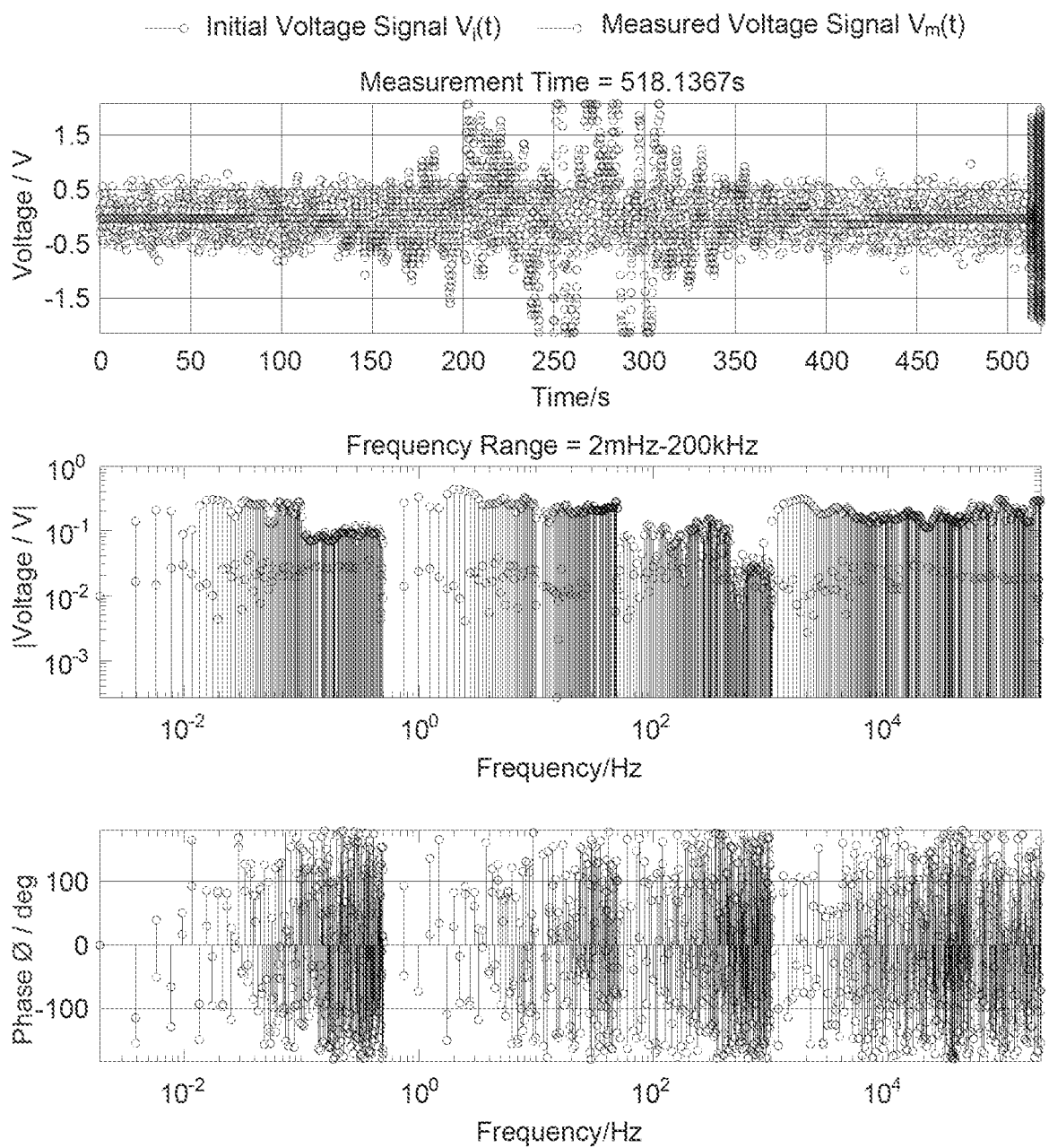
FIG. 2D shows the complete signals $V_i$ and $V_m$ both in time and frequency domains, previously depicted in FIG. 2B over four different intervals.
Figure 2E:
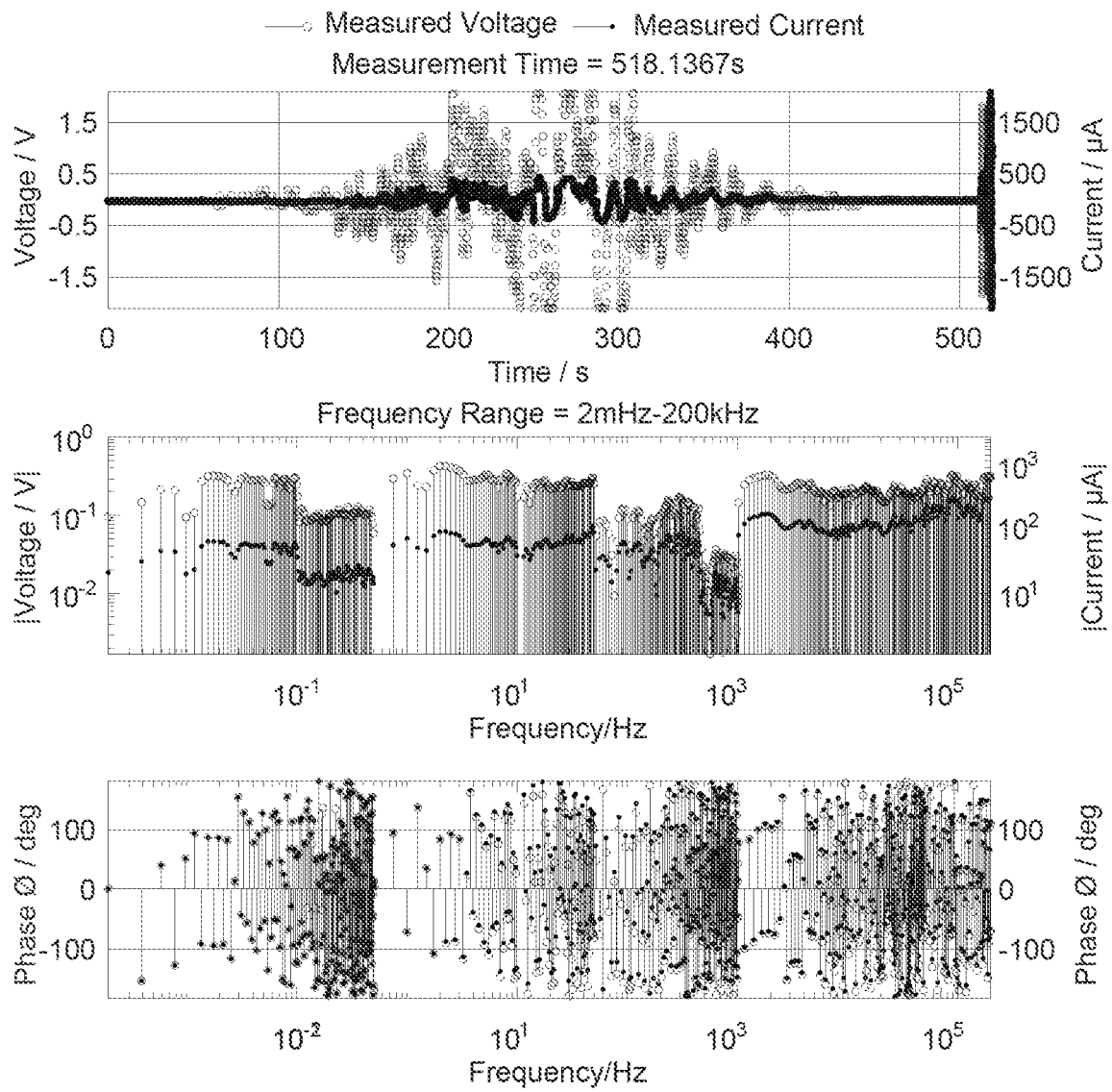
FIG. 2E shows the complete measured voltage and current signals both in time and frequency domains, as previously depicted in FIG. 2C.
Figure 3A:
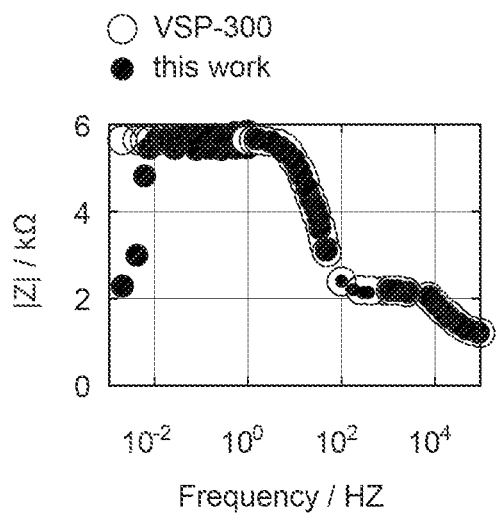
FIGS. 3A-C is a comparison of the measured impedance (magnitude, phase, and Nyquist plot) using the proposed method and that measured using a Biologic VSP-300 electrochemical station in the form of 3A—magnitude of impedance vs. frequency, 3B—impedance phase angle vs frequency, and 3C—Nyquist plot of real vs. imaginary parts of impedance.
Figure 3B:
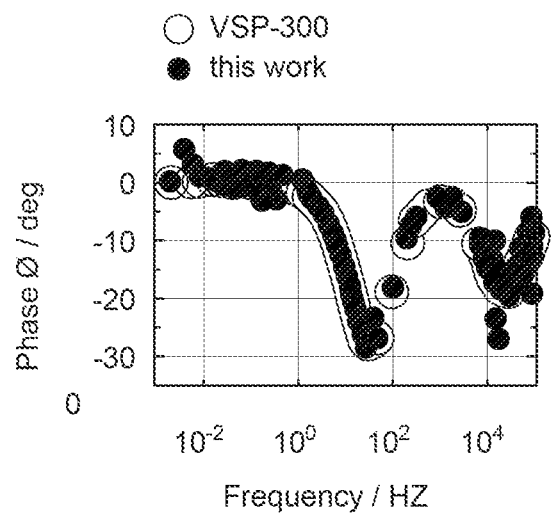
Figure 3C:
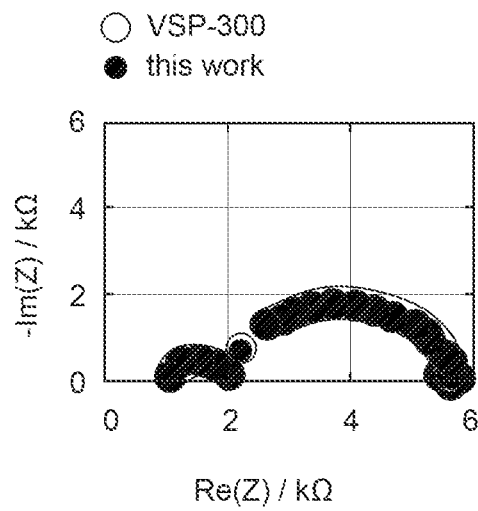
Figure 3D:
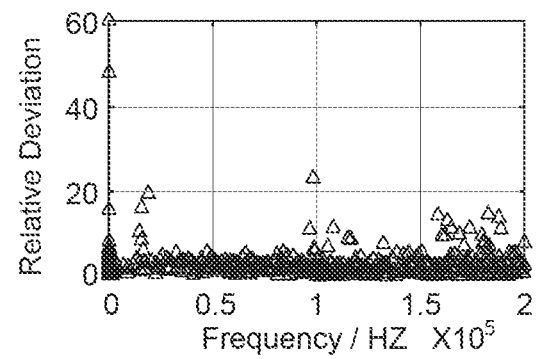
FIG. 3D represents the relative deviation of measured impedance magnitudes between the proposed method and that measured using a Biologic VSP-300 electrochemical station.

Considering setup and data acquisition in accordance with the present invention, an experimental setup is used to test and verify the impedance measurement technique, consisting of a USB interfaced DAQ Analog Discovery 2 data acquisition board (Digilent) with a 100 MS/s sampling rate (the manufacturer's WaveForms software package was used to program the board), and a precisely calibrated standard linear, time-invariant impedance cell (from Bio-Logic). In accordance with the present invention, FIG. 2A shows a standard electrical calibration cell on which the measurements were carried out. FIG. 2B depicts time domain and frequency domain components of the initial voltage signal $V_i(t)$ compared to the measured voltage signal $V_m(t)$ within different frequency ranges and with different frequency steps and FIG. 2C depicts measured voltage and current corresponding to the same frequency ranges in FIG. 2B. FIG. 2D shows the complete signals $V_i$ and $V_m$ both in time and frequency domains, previously depicted in FIG. 2B as four intervals. FIG. 2E shows the complete measured current and voltage signals both in time and frequency domains, previously depicted in FIG. 2C.

For clarity, the circuit diagram of the calibration impedance cell is shown in FIG. 2A. Following the procedure described previously in detail (see FIG. 1), the generated excitation signal is applied through the DAQ board between points A and C; i.e. $V_{AC}$. Meanwhile the voltage signal at point B is read through the DAQ board and hence the current is calculated as $V_{AB}/100$ ohm. As a result, the voltage and current needed for impedance calculation are both available. The measured impedance is compared to that obtained with a standard frequency sweep using single sine method on a state-of-the-art, research grade VSP-300 (from Bio-logic). The built-in FRA can cover the frequency range of 10 µHz up to 7 MHz with an accuracy of 1%/1° up to 3 MHz and 3% /3° to 7 MHz. The frequency range we covered in the testing of the invention was from 2 mHz to 200 kHz; i.e. 8 frequency decades, with maximum applied amplitude of +/−1.8 V.

FIG. 2B-2E show a set of plots depicting the time domain and frequency domain components of the initial voltage signal $V_i(t)$, and the measured signals $V_m(t)$ and $I_m(t)$ using the setup in accordance with the present invention. In FIGS. 2B and 2C, each row represents a different frequency range (from $F_{min}$ to $F_{max}$) covering a total of 2 mHz to 200 kHz, and different frequency steps ($F_{step}$), while FIGS. 2D and 2E show the full combined range. The splitting of the frequency range into four segments is performed in order to minimize the effect of windowing. If the whole frequency range was to be covered using one signal only, the windowing procedure will affect the frequencies at the extremities, and hence increase the overall error. However, increasing the number of segments also implies increasing the measurement time. Table I summarizes the different applied experimental conditions along with the measurement time and relative deviation from the reference VSP-300 instrument results. In all experiments, the applied voltage was set within the limits of ±1.8V. The measurement time speedup factor (compared to the reference machine) is also shown in the Table.

TABLE I

| | $F_{min}$/Hz | $F_{max}$/Hz | $F_{step}$/Hz | Time duration/s | Time speed up | Relative deviation |
|---|---|---|---|---|---|---|
| 1 | 0.002 | 1 | 0.002 | 500 | 6.79x | 1.87% |
| 2 | 1 | 50 | 0.25 | 4 | 16.0x | 2.12% |
| 3 | 50 | 1000 | 4 | 0.250 | 8.80x | 1.02% |
| 4 | 1000 | 200000 | 50 | 0.020 | 37.8x | 2.43% |
| | Overall (0.002 Hz-200 kHz) | | | 504.27 | 6.81x | 2.20% |

The overall speedup factor is clearly limited by the very low frequency segment between 2 mHz and 1 Hz. Nevertheless, a speedup of 6.81 times is achieved in this frequency range with higher speedup factors achieved at higher frequencies. Meanwhile, an average relative error of just 2.20% from the reference Bio-Logic machine is achieved over the entire frequency range indicating the excellent quality of the proposed measurement technique. FIG. 3A-D is a comparison of the measured impedance (magnitude, phase and Nyquist plot) using the proposed method and that of the VSP-300 station in the form of (a) magnitude of impedance vs. frequency, (b) impedance phase angle vs frequency, and (c) Nyquist plot of real vs. imaginary parts of impedance; (d) shows the average relative deviation of measured impedance between the two methods.

In accordance with a preferred embodiment of the present invention, a fast impedance measurement system is proposed using a conditioned and iteratively calibrated GWN signal as an excitation. The signal is freely converted to a voltage or current for potentio-static or galvano-static measurements respectively using a suitable DAQ board. Using a standard impedance calibration cell, a speedup of 6.8 times is achieved compared to traditional single sine frequency sweep method over the frequency range 2 mHz to 200 kHz, with an error less than 2.2% compared to a reference electrochemical station. The complete setup is compact and inexpensive which is appealing for portable applications. Further improvements may be achieved by optimizing the intermediate conditioning steps performed on the initial signal.

The proposed method is enhanced by designing the random excitation signal in such away that its spectral phase is derived from a discrete uniform distribution (obtained from a physically-true random number generator), but its time domain maximum amplitude remains controllable. As such impedances can be excited with adjustable amplitude signals (as low as 50 mV and up to 2V). Traditional impedance measurement techniques employed in commercial impedance analyzer devices do not depend on random signals. In previous works, a randomly generated signal (converted to a voltage or current) was directly applied to the unknown impedance in the time domain. The response (current or voltage) was then measured, converted to frequency domain via FFT and the corresponding impedance magnitude and phase are calculated. However, in the proposed technique, the generated random signal is not directly applied to the unknown impedance. This signal is first converted to the frequency domain and re-structured via iterative calibration loops. These calibration loops maintain the random phase of the signal but re-adjust the magnitude to ensure a uniform flat power spectrum over the target frequency range set by a user, while increasing the amplitude of the weakened frequencies due to software and hardware signal processing (e.g. windowing, rounding the voltage to values acceptable by the board, etc.).

Also, as part of the frequency-domain iterative re-structuring of the random signal, it is converted back into the time domain where another re-structuring takes place to ensure that the signal satisfies the minimum resolution requirements (e.g. 10 mV resolution steps) and circumvent the impact of windowing. This re-structuring in turn might affect the power spectrum of some frequencies and therefore, the signal is re-calibrated again in the frequency domain, by increasing the amplitude of these weakened frequencies. This process of re-structuring and calibration alternating between the time-domain and the frequency-domain continues until the desired frequency-domain power spectrum for all target frequencies and the desired time-domain resolution are both satisfied (as depicted in FIG. 1). Owing to the above explained iterative procedure, the error in impedance measurement using the proposed technique is minimized when compared to standard non-random-based methods overcoming most practical limitations or random-based methods (as depicted in FIG. 2).

Many changes, modifications, variations and other uses and applications of the subject invention will become apparent to those skilled in the art after considering this specification and the accompanying drawings, which disclose the preferred embodiments thereof. All such changes, modifications, variations and other uses and applications, which do not depart from the spirit and scope of the invention, are deemed to be covered by the invention, which is to be limited only by the claims which follow.

The invention claimed is:

1. A method of impedance measurement of a device under test (DUT) based on a random excitation signal, the method comprising the steps of:
generating the random excitation signal;
re-structuring the random excitation signal through a plurality of iterative calibration loops, wherein a spectral phase of the random excitation signal is derived from a discrete uniform distribution, leading to a controllable time domain amplitude;
applying the re-structured random excitation signal to the DUT through two points of a data acquisition board (DAQ) for impedance measurement.

2. The method of claim 1, wherein the random excitation signal is a structured Gaussian White Noise (GWN) signal or sequence.

3. The method of claim 2, wherein the GWN signal or sequence is generated based on user-defined input parameters comprising at least one of: white noise power level, frequency range between the minimum and maximum frequencies ($F_{min}$ and $F_{max}$), and frequency step ($F_{step}$).

4. The method of claim 3, wherein the GWN signal or sequence comprises N selected sampling frequency points such that $N=(F_{max}-F_{min})/F_{step}$.

5. The method of claim 2, wherein the GWN signal has a flat power spectral magnitude over a wide bandwidth while having a random phase.

6. The method of claim 2, wherein the re-structured GWN signal is iteratively calibrated.

7. The method of claim 1, wherein the discrete uniform distribution is obtained from a physically-true random number generator.

8. The method of claim 1, wherein the random excitation signal is converted to a voltage or current value using the DAQ, for potentio-static or galvano-static measurements respectively.

9. The method of claim 1, wherein the generated random excitation signal is in time domain.

10. The method of claim 9, wherein the random excitation signal is converted from the time domain to frequency domain prior to re-structuring the converted random excitation signal.

11. The method of claim 10, wherein the random excitation signal is converted from the time domain to frequency domain using Fast Fourier Transform (FFT).

12. The method of claim 1, wherein the plurality of iterative calibration loops maintains a random phase of the random excitation signal and re-adjusts a magnitude of the random excitation signal, thereby ensuring a uniform flat power spectrum over a test frequency range set by a user.

13. The method of claim 12, wherein the test frequency range is 2 mHz to 200 kHz.

14. The method of claim 1, wherein the plurality of iterative calibration loops results in increasing amplitude of weakened frequencies due to software and hardware signal processing.

15. The method of claim 1, wherein the DUT is a precision standard cell.

* * * * *